(12) United States Patent
Zou

(10) Patent No.: US 10,687,147 B2
(45) Date of Patent: Jun. 16, 2020

(54) MEMS MICROPHONE AND ELECTRONIC APPARATUS

(71) Applicant: GOERTEK INC., Weifang, Shandong (CN)

(72) Inventor: Quanbo Zou, Weifang (CN)

(73) Assignee: GOERTEK INC., Weifang, Shandong (CN)

( * ) Notice: Subject to any disclaimer, the term of this patent is extended or adjusted under 35 U.S.C. 154(b) by 0 days.

(21) Appl. No.: 16/316,527

(22) PCT Filed: Jul. 11, 2016

(86) PCT No.: PCT/CN2016/089637
§ 371 (c)(1),
(2) Date: Jan. 9, 2019

(87) PCT Pub. No.: WO2018/010064
PCT Pub. Date: Jan. 18, 2018

(65) Prior Publication Data
US 2019/0297427 A1  Sep. 26, 2019

(51) Int. Cl.
*H04R 17/02* (2006.01)
*H04R 31/00* (2006.01)

(52) U.S. Cl.
CPC ...... *H04R 17/02* (2013.01); *B81B 2201/0257* (2013.01); *H04R 31/003* (2013.01); *H04R 2201/003* (2013.01)

(58) Field of Classification Search
CPC .................................................. H04R 17/02; H04R 31/003; H04R 2201/003; H04R 2201/0257
See application file for complete search history.

(56) References Cited

U.S. PATENT DOCUMENTS 9,029,963 B2 * 5/2015 Sparks .................. B81B 3/0018
257/416
2012/0266686 A1 * 10/2012 Huffman ............... G01L 9/0013
73/826

FOREIGN PATENT DOCUMENTS

CN        102647657 A    8/2012
CN        103546845 A    1/2014

* cited by examiner

*Primary Examiner* — Brian Ensey
(74) *Attorney, Agent, or Firm* — Saliwanchik, Lloyd & Eisenschenk

(57) ABSTRACT

Disclosed are a MEMS microphone and an electronic apparatus. The MEMS microphone comprises: a pressure sensing element, for sensing pressure applied thereon; a diaphragm attached to the pressure sensing element and applying pressure to the pressure sensing element; and a backbone attached to the pressure sensing element and supporting the pressure sensing element.

12 Claims, 2 Drawing Sheets

MEMS MICROPHONE AND ELECTRONIC APPARATUS

CROSS REFERENCE TO A RELATED APPLICATION

This application is a National Stage of International Application No. PCT/CN2016/089637 filed on Jul. 11, 2016, which is hereby incorporated by reference in its entirety.

FIELD OF THE INVENTION

The present invention relates to the technology of MEMS, and in particular, to a MEMS microphone and an electronic apparatus.

BACKGROUND OF THE INVENTION

The Micro-Electro-Mechanical Systems, or MEMS, refers to a miniaturized mechanical and electro-mechanical member (i.e., devices and structures) that are made using the techniques of microfabrication. A MEMS microphone is a microphone which is based on MEMS technology. In the prior art, most MEMS microphones are condenser microphone.

Recently, piezoelectric MEMS microphone has been proposed. For example, a high performance piezoelectric MEMS microphone was proposed in the article of Robert John Littrell, et al, "High Performance Piezoelectric MEMS Microphones", Ph.D. dissertation, Univ. Michigan, 2010, which is hereby incorporated herein by reference.

In the piezoelectric MEMS microphone of the prior art, the piezoelectric thin films for cantilever diaphragms do not have a base structure. Thus, a stress/stress gradient will cause a diaphragm curvature of the cantilever diaphragm. As a result, the acoustic performance and/or manufacturability will be impacted. Furthermore, the cantilever diaphragms are fragile and are not robust. Consequently, the manufacturing yield is low and operation is not reliable.

Therefore, there is a demand in the art that a new MEMS microphone shall be proposed to address at least one of the problems in the prior art.

SUMMARY OF THE INVENTION

One object of this invention is to provide a new technical solution for MEMS microphone.

According to a first aspect of the present invention, there is provided a MEMS microphone, comprising: a pressure sensing element, for sensing pressure applied thereon; a diaphragm attached to the pressure sensing element and applying pressure to the pressure sensing element; and a backbone attached to the pressure sensing element and supporting the pressure sensing element.

Alternatively or in addition, the pressure sensing element is a piezoelectric element.

Alternatively or in addition, the piezoelectric element is made of MN, $SnO_2$ or PZT.

Alternatively or in addition, a diameter or side-length of the piezoelectric element is of 10~300 μm, and a diameter or side-length of the diaphragm is of 500~2000 μm.

Alternatively or in addition, the diaphragm is attached to one side electrode of the piezoelectric element, and the backbone is attached to another side electrode of the piezoelectric element.

Alternatively or in addition, the backbone includes one or more beams.

Alternatively or in addition, at least one of the beams is of 1~50 μm in width and 1~50 um in thickness.

Alternatively or in addition, the MEMS microphone further comprises a first pad and a second pad, wherein t first electrode of the pressure sensing element is connected to the first pad via the backbone, and a second electrode of the pressure sensing element is connected to the second pad via the diaphragm.

Alternatively or in addition, the MEMS microphone further comprises a substrate, wherein the pressure sensing element, the diaphragm and the backbone are mounted on the substrate.

According to a second aspect of the present invention, there is provided an electronic apparatus comprising a MEMS microphone according to the present invention.

An embodiment of this invention proposes a MEMS microphone with a new structure of backbone supporting a pressure sensing element. The MEMS microphone has a relatively robust MEMS structure.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
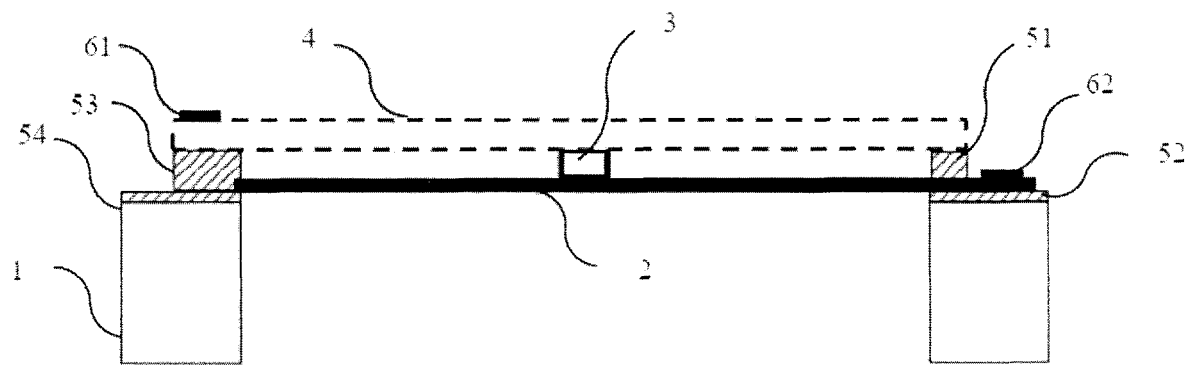
FIG. 1 is a lateral view of a portion of a MEMS microphone according to a first embodiment.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In the prior art, the MEMS microphone contains piezoelectric films for cantilever diaphragms without base structure. Thus, the fragile diaphragm structure leads to low manufacturing yield and/or operation reliability issues.

In this invention, a new structure of pressure sensing element is proposed. The pressure sensing element could be a piezoelectric element or a piezo-resistive element. By means of this structure, the MEMS microphone will have a relatively robust MEMS structure. Furthermore, the manufacturability/yield thereof will be improved. The following embodiments will be described with reference to a piezoelectric element. It will be appreciated by a person skilled in the art that a piezo-resistive element will be also possible.

Figure 2:
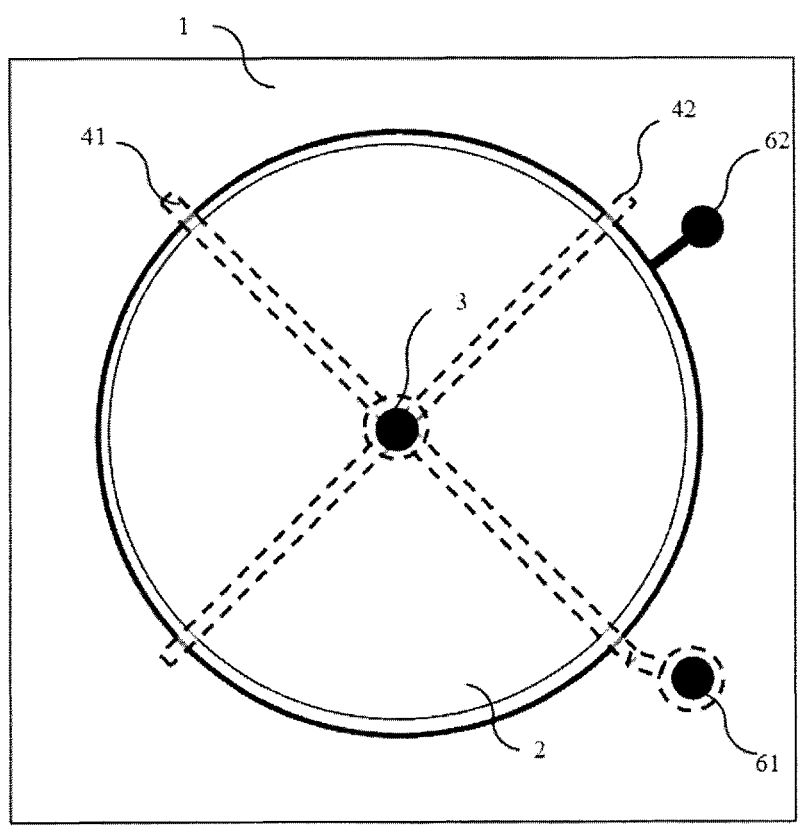
FIG. 2 is a top view of the MEMS microphone of FIG. 1.

An embodiment will be described with reference to FIGS. 1 and 2. FIG. 1 shows a lateral view of a portion of a MEMS microphone according to a first embodiment. FIG. 2 shows a top view of the MEMS microphone of FIG. 1

As shown in FIG. 1, the MEMS microphone comprises a pressure sensing element 3, a diaphragm 2 and a backbone 4.

The sensing element 3 is for sensing pressure applied thereon. The diaphragm 2 is attached to the pressure sensing element 3 and is for applying pressure to the pressure sensing element 3. The backbone 4 is attached to the pressure sensing element and is for supporting the pressure sensing element 3. The backbone 4 is rigid and thus provides the piezoelectric element 3 with a robust support.

In this invention, the diaphragm 3 can be supported by a substrate 1 at periphery. Compared with the piezoelectric solution of the prior art, this structure provides a relatively robust diaphragm.

In an example, the pressure sensing element 3 is a piezoelectric element. For example, the piezoelectric material of the piezoelectric element is a crystal material which can produce a voltage between two sides thereof under pressure. The material of the piezoelectric element 3 can be AlN, $SnO_2$ or PZT.

For example, a high quality piezoelectric (like AlN) element 3 is manufactured on a standard MEMS wafer (not shown), followed by a low-temperature back-end process to attach it to a rigid backbone 4. It will be understood by a person skilled in the art that the above examples are only intended to be illustrative but not to limit the scope of the present invention.

In the embodiment, the size of piezoelectric element 3 is much smaller than that of the diaphragm 2. By this configuration, the pressure intensity applied on the piezoelectric element 3 will be increased and thus the Signal-Noise-Ratio (SNR) of the microphone will be improved. For example, the piezoelectric element 3 is in a shape of round or square. The diameter or side-length of the piezoelectric element 3 is of 10~300 μm, and the diameter or side-length of the diaphragm is of 500~2000 μm, for example.

As shown in FIGS. 1 and 2, the diaphragm 2 is attached to one side electrode of the piezoelectric element 3, and the backbone 4 is attached to another side electrode of the piezoelectric element 3, for example. It will be appreciated by a person skilled in the art that the backbone 4 can be attached with the piezoelectric element 3 in other manners as long as the backbone 4 can provide the piezoelectric element 3 with a robust support. For example, the piezoelectric element 3 can be embedded in the backbone 4.

The backbone 4 can include one or more beams. In FIG. 2, backbone 4 has two beams 41, 42. The piezoelectric element 3 is located at the cross point of the beams 41, 42. The beams 41, 42 faun a relatively robust structure. For example, at least one of the beams 41, 42 is of 1~50 μm in width and 1~50 um in thickness.

As shown in FIGS. 1 and 2, the MEMS microphone further comprises a first pad 61 and a second pad 62. A first electrode of the pressure sensing element 3 is connected to the first pad 61 via the backbone 4. For example, the backbone 4 can be electrically conductive or a conductive lead is provided on the backbone 4. A second electrode of the pressure sensing element 3 is connected to the second pad 61 via the diaphragm 2. The diaphragm 2 can be electrically conductive or a conductive lead is provided on the diaphragm. The first pad 61 and the second pad 62 are used to output signals, for example.

As shown in FIG. 2, the MEMS microphone further comprises the substrate 1. The pressure sensing element 3, the diaphragm 2 and the backbone 4 are mounted on the substrate 1 through bonding or gluing, for example. For example, as shown in FIG. 1, the pressure sensing element 3, the diaphragm 2 and the backbone 4 are mounted on the substrate 1 via dielectric layers 51, 52, 53, 54.

Unlike the prior art piezoelectric MEMS microphone, the piezoelectric element is not used as a cantilever diaphragm. This can, on one hand, produce a relatively stable structure. On the other hand, this provides a freedom of design of the pressure sensing element, for example, to reduce the parasitic capacitance between two electrodes of the piezoelectric element.

Furthermore, since the dimension of the backbone 4 is much smaller than that of the diaphragm 2, the acoustic damping/resistance between the diaphragm and the backbone is minimized.

Figure 3:
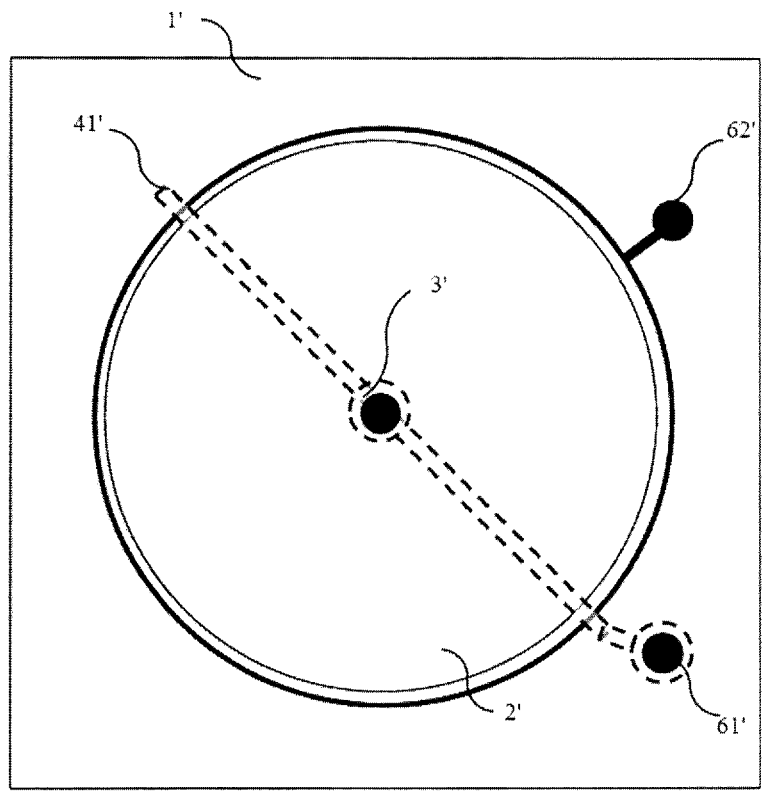
FIG. 3 is a top view of a portion of a MEMS microphone according to a second embodiment.

FIG. 3 shows a top view of a portion of a MEMS microphone according to a second embodiment. The repetitive contents with the first embodiment will be omitted.

As shown in FIG. 3, the MEMS microphone includes a pressure sensing element 3', a diaphragm 2' and a backbone 41'. The MEMS microphone further includes a first pad 61' and a second pad 62'. The diaphragm 2' and the backbone 41' are mounted on a substrate 1'. The configuration of the MEMS microphone of the second embodiment is similar with that of the first embodiment except that the backbone includes just one beam 41'. By this configuration, the dimension of the backbone is further reduced and the acoustic damping/resistance between the diaphragm and the backbone can be further lowered.

Figure 4:
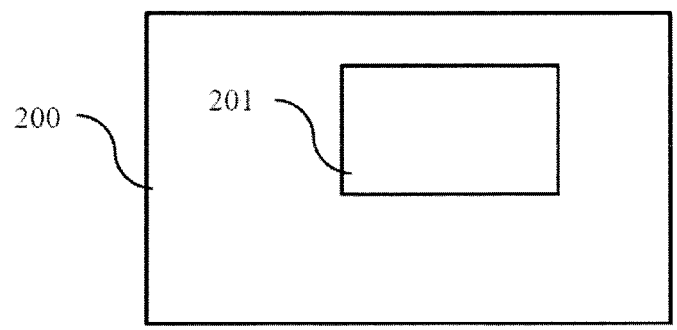
FIG. 4 shows a schematic diagram of an electronic apparatus with a MEMS microphone according to embodiments of this invention.

FIG. 4 shows a schematic diagram of an electronic apparatus with a MEMS microphone according to embodiments of this invention.

As shown in FIG. 4, the electronic apparatus 200 comprises a MEMS microphone 201. The MEMS microphone 201 can be the MEMS microphone according to the first embodiment or the second embodiment, as shown in FIGS. 1, 2, 3, for example. The electronic apparatus 200 can be a smart phone, pad, notebook and so on.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A MEMS microphone, comprising:
   a pressure sensing element, for sensing pressure applied thereon;

a diaphragm attached to the pressure sensing element and applying pressure to the pressure sensing element; and a backbone attached to the pressure sensing element and supporting the pressure sensing element.

2. The MEMS microphone according to claim 1, wherein the pressure sensing element is a piezoelectric element.

3. The MEMS microphone according to claim 2, wherein the piezoelectric element is made of AlN, $SnO_2$ or PZT.

4. The MEMS microphone according to claim 2, wherein a diameter or side-length of the piezoelectric element is of 10~300 μm, and a diameter or side-length of the diaphragm is of 500~2000 μm.

5. The MEMS microphone according to claim 2, wherein the diaphragm is attached to one side electrode of the piezoelectric element, and the backbone is attached to another side electrode of the piezoelectric element.

6. The MEMS microphone according to claim 2, wherein the backbone includes one or more beams.

7. The MEMS microphone according to claim 6, wherein at least one of the beams is of 1~50 μm in width and 1~50 um in thickness.

8. The MEMS microphone according to claim 1, further comprising a first pad and a second pad, wherein a first electrode of the pressure sensing element is connected to the first pad via the backbone, and a second electrode of the pressure sensing element is connected to the second pad via the diaphragm.

9. The MEMS microphone according to claim 1, further comprising a substrate, wherein the pressure sensing element, the diaphragm and the backbone are mounted on the substrate.

10. An electronic apparatus, comprising a MEMS microphone according to claim 1.

11. An electronic apparatus, comprising a MEMS microphone according to claim 2.

12. The MEMS microphone according to claim 1, wherein the backbone is mounted via its two opposite ends on the substrate.

* * * * *